United States Patent [19]

Soclof

[11] Patent Number: 4,683,399

[45] Date of Patent: Jul. 28, 1987

[54] SILICON VACUUM ELECTRON DEVICES

[75] Inventor: Sidney I. Soclof, San Gabriel, Calif.

[73] Assignee: Rockwell International Corporation, El Segundo, Calif.

[21] Appl. No.: 278,528

[22] Filed: Jun. 29, 1981

[51] Int. Cl.[4] ........................ H01L 29/90; H01J 40/16

[52] U.S. Cl. .................................... 313/537; 313/495; 313/529; 357/13

[58] Field of Search ............... 313/495, 102, 529, 537; 357/32, 13

[56] References Cited

U.S. PATENT DOCUMENTS

| | | | |
|---|---|---|---|
| 2,960,659 | 11/1960 | Burton | 357/13 X |
| 3,458,744 | 7/1969 | Jowers et al. | 313/102 X |
| 4,099,198 | 7/1978 | Howorth et al. | 357/31 X |
| 4,259,678 | 3/1981 | Van Gorkom et al. | 357/13 |
| 4,303,930 | 3/1981 | Van Gorkom et al. | 357/13 |

OTHER PUBLICATIONS

"Power FETs and Their Applications", Edwin S. Oxner, Prentice-Hall, Inc., 1980.

*Primary Examiner*—Palmer C. DeMeo
*Attorney, Agent, or Firm*—H. Fredrick Hamann; George A. Montanye; Wilfred G. Caldwell

[57] ABSTRACT

A vacuum electron device including a semiconductor device in a hermetically sealed container enclosing a vacuum. The device includes an electron emissive source for emitting electrons into the vacuum, and a collector for collecting electrons emitted from the electron emissive source and tranported through the vacuum. The device is subjected to a high internal electric field such that electrons in the emissive source are excited to energies greater than the electron affinity of the semiconductor body.

102 Claims, 15 Drawing Figures

SILICON VACUUM ELECTRON DEVICES

BACKGROUND OF THE INVENTION

1. Field of the Invention

The present invention is concerned with electron devices with ultra-short transit times, and more particularly with semiconductor devices which are hermetically sealed in a vacuum and in which charge carriers move through a vacuum.

2. Description of the Prior Art

The operation of semiconductor devices in a vacuum environment has been known in the prior art.

U.S. Pat. No. 3,105,166 (Choyke et al) provides a cold emissive cathode for emitting electrons into a vacuum. A PN junction is reverse biased by an electric field between the cathode and anode. The diode is enclosed in a vacuum tight container, and reverse bias of 7 to 20 volts is provided to the junction. A collecting potential of 135 volts is aplied to the anode.

U.S. Pat. No. 3,310,701 (Heimann) discloses a photocathode responsive to light radiation for emitting luminous energy electrons in an evacuated envelope. The electrons travel through the vacuum to the anode under the influence of operating potential applied to the cell. The photoemissive layer is P type and is adjacent an N type layer in the structure of FIG. 1.

U.S. Pat. No. 4,197,564 (Klimin et al) provides a photo-emitter coated with a layer reducing the electron work function of the substrate.

U.S. Pat. No. 4,163,949 (Shelton) teaches an apparatus comprising an emitting fiber for emitting electrons for collection by an anode or collector. Emission is responsive to application of a potential and may be further controlled by variation of applied potential to a conducting layer used to form a grid or control electrode. Electrons are emitted in a vacuum and the device combines features of a vacuum tube and a transistor.

U.S. Pat. No. 3,593,067 (Flynn) discloses an integrated diode array, having a plurality of grooves isolating the individual diodes, the array is biased so that the charge depletion layer of the PN junction extends beyond the grooves. Radiation is directed at one layer covering a single P layer for the entire structure. The grooves are formed at the bottom of the structure and electrons travel through the solid material.

U.S. Pat. No. 4,100,564 (Sasayama) discloses a semiconductor structure including a N+ layer below an N type substrate layer, the combination surmounted by a P type layer. The structure is provided with grooves.

U.S. Pat. No. 4,106,975 (Berkenblit) teaches a method for etching an aperature, with a particular crystallographic geometry, in single crystals which includes a step of anisotropically etching the structure. The resultant groove is depicted as being substantially vertical through three layers and has a "V" shaped cross-section through the substrate. One of the layers is a platinum-type while the other layers are both chromium-type.

U.S. Pat. No. 4,140,558 (Murphy et al) provides a multi-layer semiconductor device having a number of narrow grooves, having sidewalls in the (111) plane etched into the structure. The grooves are used for isolation of individual circuits.

U.S. Pat. No. 3,885,189 (Picker et al) discloses a semiconductor junction used as a target in a CRT. The semiconductor layer is rendered relatively highly conductive on the side of the target exposed to the light by overdoping the surface with the same conductivity type impurity as the remainder of the body. The opposite side of the layer has a junction formed therewith by a layer of dielectric material of substantially higher bulk resistance.

U.S. Pat. No. 2,776,367 (Lehovec) discloses an interaction between photons and conductors in a PN junction, providing a photon modulated, semiconductor current source.

A grooved structure, having a plurality of PNPN light activated switches, is shown in U.S. Pat. No. 3,344,278 (Yanai). Operation of the device, however, does not rely upon a vacuum in the regions between the several individual switches.

Although some of the above noted prior art does disclose electron emission into a vacuum, such references do not disclose or anticipate high speed semiconductor devices using charge carrier transport through a vacuum.

SUMMARY OF THE INVENTION

Briefly, and in general terms, the invention concerns a semiconductor device comprising a hermetically sealed container enclosing a vacuum; and a semiconductor body including a substrate of a first conductivity type and a first dopant concentration in the container. A layer of semiconductor material of a second conductivity type and a second dopant concentration is disposed on the body; and there are grooves in the body extending through the layer of semiconductor material and into the semiconductor substrate so that a current path for charge carriers is formed through vacuum from the semiconductor substrate to the layer of semiconductor material.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

The present invention is concerned with electron devices with ultra-short transit times, and more particularly with semiconductor devices which are hermetically sealed in a vacuum and in which charge carriers move through a vacuum.

The material or medium in which charge carriers have the highest mobility is vacuum, and for such reason the ultra-fast electron devices according to the present invention uses this medium. The present invention employs the technology of silicon device processing, as well as fine-line lithography technology in producing sub-micron patterns on semiconductor wafers for production of very high speed electron devices and integrated circuits (VHSIC) operating in a vacuum.

In the devices according to the first embodiment of the present invention, there is electron emission and electron transport in a vacuum from a first silicon electrode. In a second embodiment the electrode is coated with a thin layer of some material with a suitably low work function for the photo-electric emission of electrons. The electrons that are emitted from this first electrode are transported through the vacuum to a second silicon electrode which is situated close to the first electrode. The voltage applied to the second electrode (to be called the "collector") will be positive with respect to that applied to the first electrode (to be called the "emitter"). Such a device is a vacuum diode having a very short transit time. The current flow through this device is controlled by the photon flux incident on the emitter and the polarity of the collector voltage with respect to the emitter. This device can thus be employed as a very fast photodiode, or as a very fast detector diode. Other embodiments will be described subsequently.

Figure 1A:
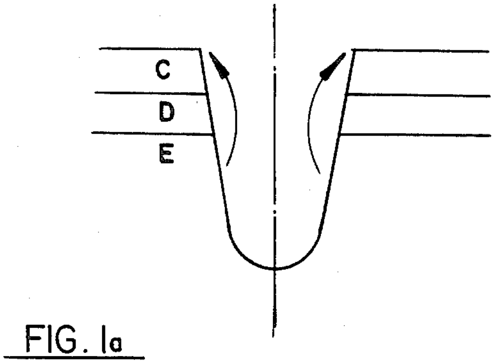
FIG. 1A is a highly simplified cross-sectional view of a vacuum diode according to the present invention.

Turning first to FIG. 1, there is shown a highly simplified cross-sectional view of a silicon vacuum diode as implemented in a semiconductor body preferably monocrystalline silicon, in accordance with the present invention. FIG. 1A shows a layered silicon structure surrounding a groove or cavity in the semiconductor body. The structure includes an emitter layer labeled E, a collector layer labeled C and a dielectric layer labeled D, the dielectric layer D electrically separating and isolating the emitter and collector layers E and C respectively. The collector layer C may be polycrystalline silicon or a metal.

The entire device is assumed to be contained in a hermetically sealed container (not shown) enclosing a vacuum. A sufficiently high internal electric field is provided in the body of the material comprising the emitter layer so that the electrons are excited to energies greater than the electron affinity of the semiconductor material at the emitter layer surface region. Electrons are therefore ejected from the emitter layer into the vacuum in the groove or cavity as shown by the arrows in FIG. 1A. A potential (not shown) is provided between the electron emissive source (the emitter layer) and the collector layer so that the electrons are attracted to the collector layer, and an electrical output is derived therefrom. It is assumed that appropriate electrical contacts are made to appropriate portions of the semiconductor body including the electron emissive source (that is, the emitter layer) as well as to the collector layer. These contacts have not been shown in FIG. 1 for simplicity.

Figure 1B:
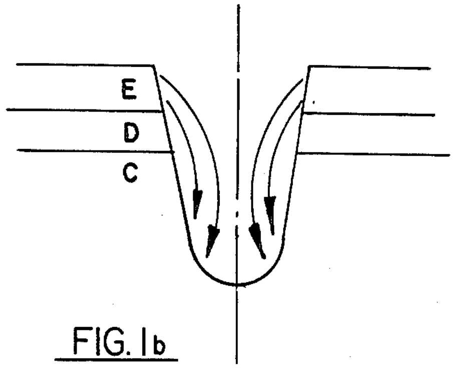
FIG. 1B is a highly simplified cross-sectional view of an alternative configuration of the vacuum diode according to the present invention.

FIG. 1B is a highly simplified cross-sectional view of an alternative configuration of the vacuum diode as implemented in a semiconductor body in accordance with the present invention. The figure shows a layered silicon structure surrounding a groove or cavity similar to that in FIG. 1A, the structure includes an emitter layer, labeled E; a collector layer, labeled C; and a dielectric layer, labeled D, which electrically separates and isolates the emitter and collector layers. The entire device is again assumed to be contained in a hermetically sealed container (not shown) enclosing a vacuum. In this case, the emitter layer E is at the top major surface of the semiconductor body and the collector layer is the lower surface. A similar groove extends into the body of the semiconductor material through the emitter, collector and dielectric layers. Further details of the shape of the groove, as well as the method of etching such a groove, will be described subsequently.

Figure 2A:
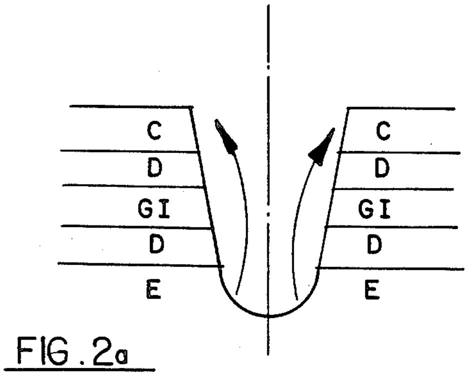
FIG. 2A is a highly simplified cross-sectional view of a silicon vacuum triode device according to the present invention.
Figure 2B:
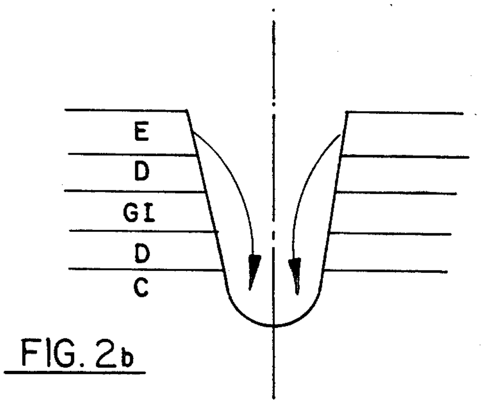
FIG. 2B is an alternative configuration of a silicon vacuum triode according to the present invention.

FIG. 2A and 2B are highly simplified cross-sectional view of a second embodiment of the present invention illustrating a silicon vacuum triode device. The device consists of a number of layers formed from a semiconductor body, preferably monocrystalline silicon. The layers consist of an emitter layer E, a grid layer GI, and a collector layer C. In FIG. 2A, the electron emissive layer is lower layer in the composite structure. The emitter layer E and the grid layer GI are separated by a dielectric layer D. Similarly, the grid layer GI and the collector layer C are separated by a separate dielectric layer D. The composite sandwich of layers E, D, GI, D and C may be formed from a single semiconductor body according to the techniques known in the art.

FIG. 2B is another cross-sectional view of a silicon vacuum triode device in which the electron emissive layer is the layer adjacent to the top major surface of the semiconductor body, while the collector region is the layer at a lower level in the composite. The emission of electrons are shown by arrows in FIGS. 2A and 2B. As in FIGS. 1A and 1B, the entire device is assumed to be contained in a hermetically sealed container (not shown) enclosing a vacuum. A sufficiently high internal electric field is provided in the body of the material comprising the emitter so that the electrons are excited to energies greater than the electron affinity of the semiconductor material in the emitter region. Electrons are therefore ejected from the emitter into the vacuum as shown by the arrows in FIGS. 2A and 2B. A potential (not shown) is provided between the electron emissive source and the collector electrode so that the electrons are attracted to the collecting electrode, and an electrical output is derived therefrom. It is assumed that appropriate contacts are made to the portion of the semiconductor body including the electron emissive source, (that is, the emitter), as well as to the collector. These contacts have not been shown in FIG. 2 for simplicity.

Figure 3:
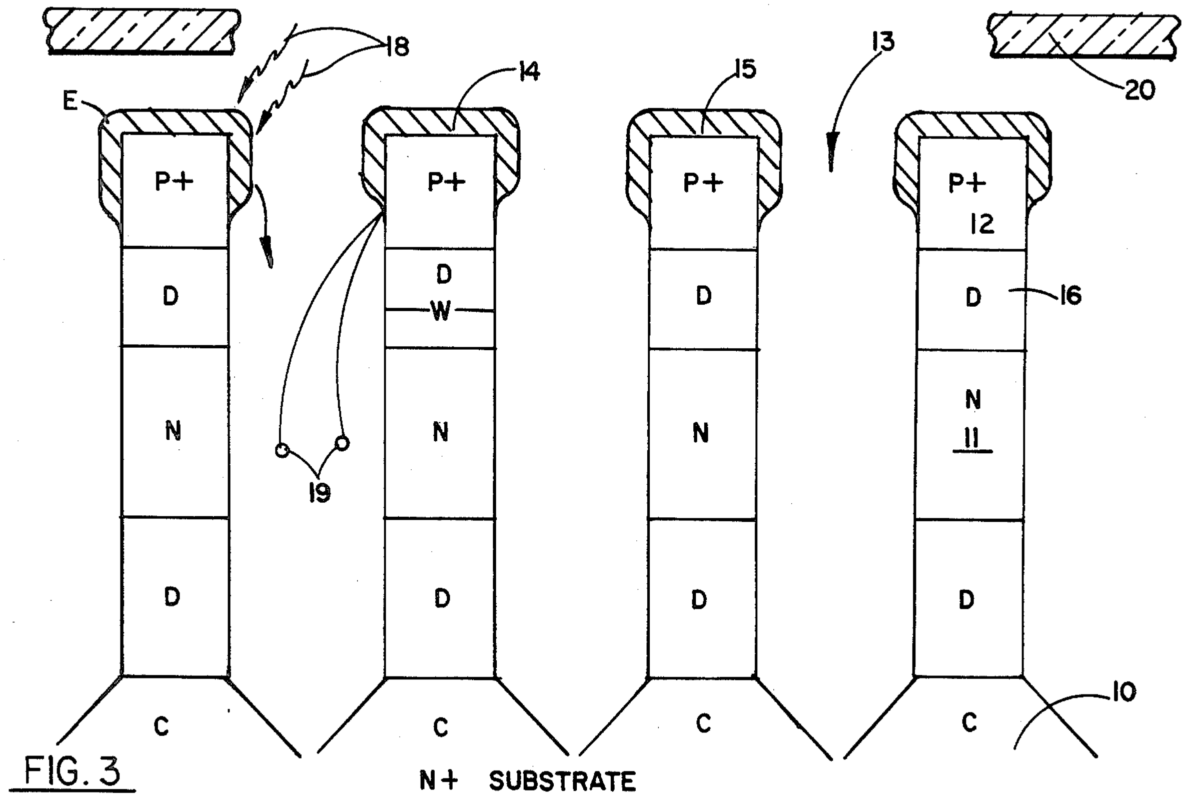
FIG. 3 is a highly simplified cross-sectional view of an embodiment of the present invention using a photo-emissive layer as the electron emissive source.

Turning now to FIG. 3, there is shown a highly simplified cross-sectional view of a vacuum triode device according to the present invention. The triode device is contained within a hermetically sealed container enclosing a vacuum. In a preferred embodiment of the triode device shown in FIG. 3, the container includes a transparent lid 20 for permitting light or other electromagnetic radiation to be transmitted to the semiconductor body disposed within the container.

Turning now to the specific structure of the semiconductor body, FIG. 3 shows a layered silicon structure including an emitter layer labeled E, a collector layer labeled C, a grid layer labeled N, and two dielectric layers, labeled D, electrically separating and isolating the emitter grid, and collector layers. The entire device is assumed to be contained in a hermetically sealed container (a lid 20 of which is shown) enclosing a vacuum. In this embodiment, the emitter layer E is at the top major surface of the semiconductor body while the collector layer is the lower surface. An elongated groove or cavity extends into the body of semiconductor material through the emitter, collector and dielectric layers. Further details of the shape of the groove, as well as the method of etching such a groove, will be described subsequently.

The substrate 10 is a silicon semiconductor body with a (110) orientation typically having a resistivity of approximately 0.005 ohm-cm, on which a N-type (lightly doped) epitaxial layer 11 of approximately 1 ohm-cm resistivity is deposited having a thickness of 5 $\mu$m.

A P+ diffusion is then carried out to convert a top portion 12 of the N-type epitaxial layer to P+ type.

An etch-resistant layer is then provided on the silicon surface, such as a thermally grown $SiO_2$ layer or a chemical vapor deposited (CVD) silicon nitride ($Si_3N_4$) layer. The structure of the figures can be described as follows. Above the semiconductor layer 11, is another dielectric layer 16, also labeled D for dielectric which separates the semiconductor layer 11 from the P+ top portion 12. The composite according to the present invention, therefore consists of a sequence of layers labeled C for collector, D for dielectric, N for N-type semiconductor layer, D for another dielectric layer, and P+ for the top portion of the semiconductor body.

Using standard photolithographic processes, a fine line pattern is produced on the surface consisting of open lines parallel to the (111) planes that intersect the surface (a 110 plane) at right angles. The wafer is then immersed in an anisotropic etchant such as NaOH or KOH to etch deep, steep walled, grooves 13, in the silicon as shown in the cross-sectional view of FIG. 3.

The top surface is then coated with a material 14 that is characterized by a low work function (EF) and a high quantum efficiency for the photoelectric emission of electrons. The coating is provided by a vacuum evaporation process in such a way that both the tops of the silicon "fingers" 15 as well as a limited portion of the sidewalls 16 get coated by the photoemissive material. The device is then encapsulated in a package 20 with a transparent window and sealed under vacuum. A metal can package of the type used for conventional silicon photodiodes can be used for encapsulation.

In the operation of the device of FIG. 3 as a high-speed photodiode, a large reverse bias voltage is applied so as to deplete most or all of the N-type epitaxial regions. Under such conditions, there will be a strong electric field in the N-type semiconductor region and in the adjoining vacuum region. When the emitter region is illuminated by photons 18 of suitably short wave length, photoemission of electrons 19 will occur. The emitted electrons will be accelerated by the electric field in the vacuum region toward the collector C (N+ region). Since the distance between the emitter and collector regions can be made very short, the transit time will be correspondingly short.

The emitter to collector transit time will be given by $$t_{TRANSIT} = \sqrt{\frac{2X}{a}} = \sqrt{\frac{2XM}{qE}}$$

$$\cong \sqrt{\frac{2X^2M}{qV}} = \left(\sqrt{\frac{2M}{qV}}\right) X$$

where X is the emitter-to-collector distance and V is the reverse bias voltage between the emitter and the collector. The parameter a is acceleration, q is charge, and M is the mass of the electron.

If $X=2$ $\mu$m and $V=20$ volts ($E=1\times10^5$ V/M$<\epsilon$breakdown) then $$t_{TRANSIT} = \sqrt{\frac{2m}{q}} \frac{X}{\sqrt{V}}$$

$$= (3.37 \times 10^{-6}) \frac{X(m)}{\sqrt{V(\text{Volts})}}$$

$$= 3.37 \times 10^{-12} \frac{X(\mu\text{m})}{\sqrt{V(\text{Volts})}}$$

$$= 3.37 \text{ ps} \frac{X(\mu\text{m})}{\sqrt{V(\text{Volts})}}$$

For $X=2$ $\mu$m, and $V=20$ volts, we have $$t=1.5 \text{ ps}$$

which is a very short transit time.

It is of interest to compare this result to the corresponding transit time for electrons in silicon. Using the saturation velocity value of $U_{sat}=1\times10^7$ cm/sec we have $$t_{TRANSIT} = \frac{X}{V_{sat}} = \left(1 \times 10^{-7} \frac{\text{sec}}{\text{cm}}\right) X$$

-continued $$= \left(1 \times 10^{-7} \frac{\text{sec}}{\text{cm}}\right) \left(10^{-4} \frac{\text{cm}}{\mu\text{m}}\right) X$$

$$= \left(1 \times 10^{-11} \frac{\text{sec}}{\mu\text{m}}\right) X$$

$= (10\ \text{ps}/\mu\text{m})\ X$, so that if $X=2\ \mu$m the transit time will be 20 ps.

For a high speed device, the inter-electrode capacitance may be a limiting factor. This capacitance can be reduced by making the width of the silicon fingers (dimension W in FIG. 3) very narrow.

The device capacitance can be reduced even further by coating the tops of the fingers with some suitable etch resistant material (such as silicon nitride) and then using an isotropic etchant to remove the N-type portion of the fingers. The etch-resistant layer can be removed and the remaining tops of the silicon fingers can be coated with the photoemissive material.

Figure 4A:
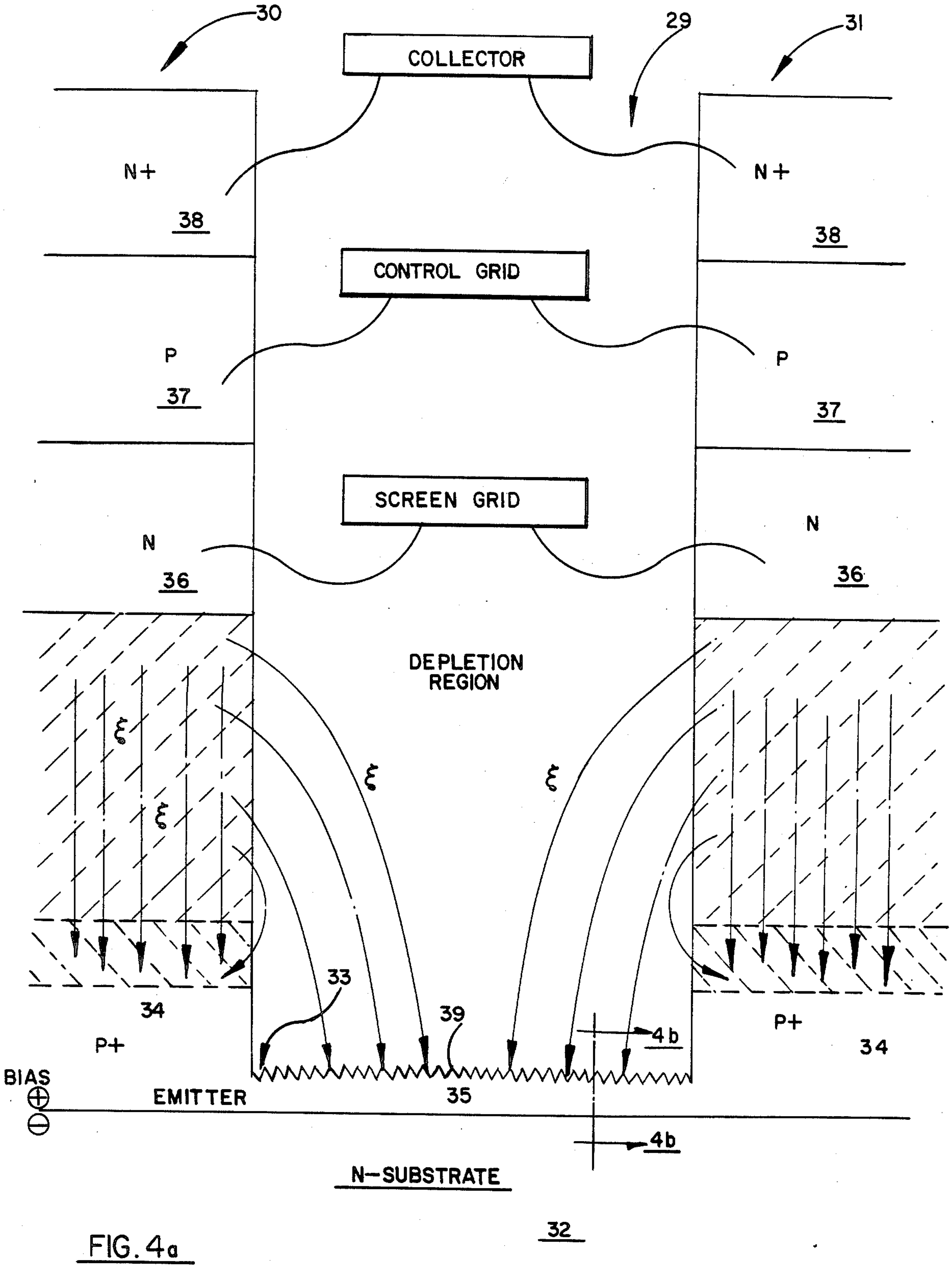
FIG. 4A is a highly simplified cross-sectional view of a second embodiment of the present invention using an applied external field to cause electron emission.

Turning now to FIG. 4A, there is shown a highly simplified cross-sectional view of a second embodiment of the present invention having two grids and utilizing an applied external field to cause electron emission. Like the embodiment shown in FIG. 3, the semiconductor device is contained within a hermetically container enclosing a vacuum. The container is not shown in FIG. 4A for simplicity. Turning now to the specific structure of the semiconductor body, FIG. 4A shows two elongated semiconductor fingers 30 and 31, which are mesa-like structures disposed upon a semiconductor body substrate 32. Spaced between the fingers, 30 and 31, is a cavity 29, through which electrons flow when the semiconductor device is appropriately biased. In the preferred embodiment a P+ type epitaxial layer 33, is deposited over the N-type substrate. A portion 34, of the epitaxial layer forms a stratified region of the fingers 30 and 31 where they adjoin the substrate 32, and another thiner portion 35 of the P+ type epitaxial layer adjoins the substrate 32 in the region of the cavity 29.

Above the P+ epitaxial layer is an N-type layer, 36, which adjoins the P+ layer 34 in the fingers 30 and 31. The N-type layer functions as a screen grid in the vacuum electron device according to the present invention. Overlying the N-type layer 36 is a P-type layer 37 which functions as the control grid in the vacuum electron device according to the present invention.

Finally, overlying and adjoining the P-type region 37, is a N+ type region 38 which forms the uppermost layer of the fingers 30 and 31. The N+ type layer 38 functions as the collector in the vacuum electron device.

Figure 4B:
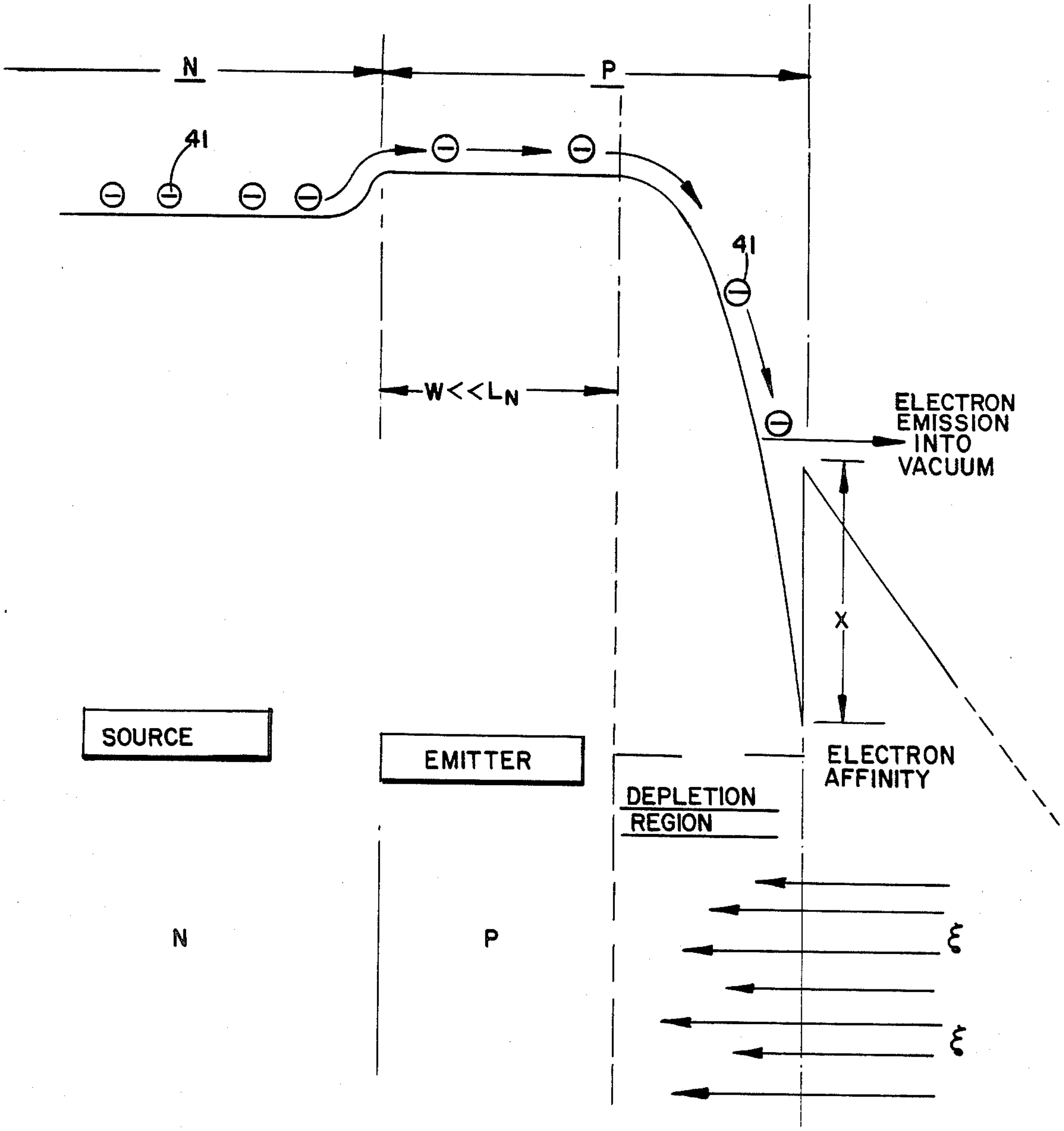
FIG. 4B is a potential energy diagram of the configuration shown in FIG. 4A to indicate the energy dynamics of the electrons.

The operation of the electron device, shown in FIG. 4A may best be described in the potential energy diagram, shown in FIG. 4B.

The potential energy diagram, shown in FIG. 4B refers to potential energy in the region through the 4B—4B plane shown in FIG. 4A. The left hand portion of the figure represents the potential of the electrons in the N type substrate 32, labelled "source". A rectifying pn junction exists between the N type substrate 32 and the P+ type layer 33, labelled "emitter". When the N type substrate 32 is forward biased with respect to the P type layer 33, an electric field is produced in the semiconductor body as shown by the electric field lines $\epsilon$ represented by solid lines. The result of the electric field $\epsilon$ is the creation of a depletion region parallel to the surface. The depletion region has a lower potential energy which attracts electrons 41 from the emitter into the depletion region. The movement of electrons 41 is shown by the direction of the electrons 41 moving from the left hand portion of FIG. 4B to the right hand portion of the figure. The source and emitter regions 32 and 34 respectively are forward biased so that the electrons flow from the source region into the emitter region. As shown diagramatically in FIG. 4A, the exposed surface 39 of the layer 33 may be textured by means of an appropriate etching technique so as to enhance the electron emissive properties of the surface. The net effect of the potential energy, as shown in FIG. 4B, is that a sufficient high internal electric field is present in the semiconductor body near the rectifying pn junction so that conduction band electrons in the region are excited to energies greater than the electron affinity of the semiconductor material at the exposed surface 39, so that such electrons are emitted from such surface.

Figure 5A:
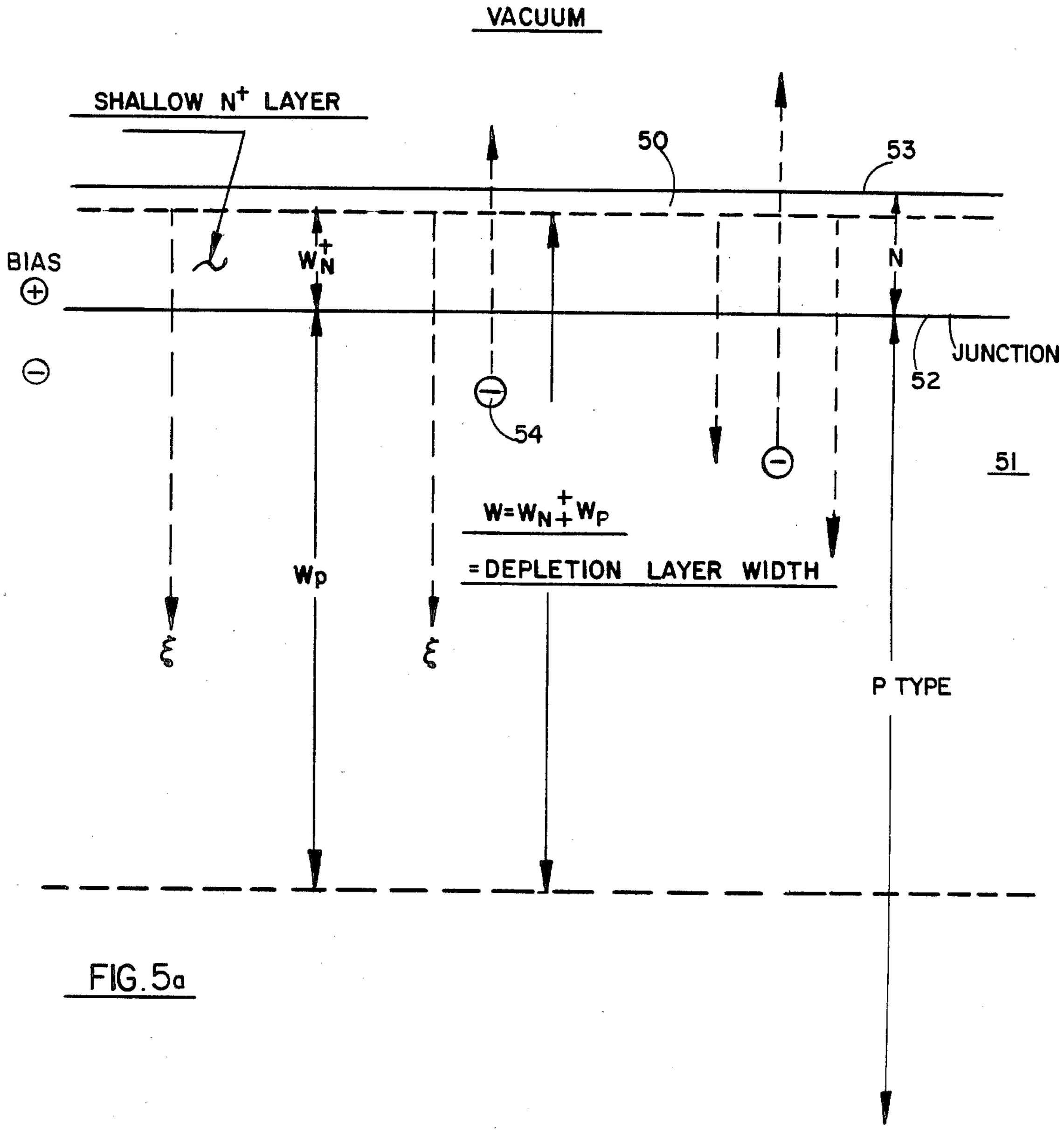
FIG. 5A is a highly enlarged and simplified cross-sectional view of a third embodiment of a silicon electron device according to the present invention in which electron emission is achieved by application of a large reverse bias voltage to a pn junction.

It is not necessary that an applied external field be used to create conditions so that conduction band electrons are excited in the emitter region to energies greater than the electron affinity of the semiconductor material. FIG. 5A shows a highly enlarged and simplified cross-section view of yet a third embodiment of a silicon electron device, according to the present invention, in which electron emission is achieved by application of a large reverse bias to a pn junction.

More particularly, the FIG. 5A shows the portion of the semiconductor body adjacent to the vacuum into which electrons are emitted. The body includes a thin N conductivity type layer 50 adjacent to the vacuum. Adjoining the N type layer is a P conductivity type layer 51. A rectifying junction 52 is formed between layer 50 and 51 which extends substantially parallel to the exposed surface 53 of the semiconductor body. The junction is reversed biased so that electrons 54 present in the P type layer 51 are accelerated across the junction 52 into the N type region 50. It is highly advantageous in the configuration according to the present invention, that the rectifying junction 52 be disposed essentially parallel to the surface 53. Under such conditions, the electrons accelerating across the junction accelerate in the direction of the surface 53. Furthermore, in view of the fact that the junction is in the proximity of the surface 53, the configuration according to the present invention permits the highly energetic electrons travelling in the direction of the surface to escape therefrom into the vacuum. Such a configuration is a significant improvement over prior art designs (such as United Kingdom Pat. No. 1,303,659, or U.S. Pat. No. 4,259,678) in which the pn junction terminates at the major surface so that accelerated electrons, as well as electrons generated from avalanche breakdown, are directed parallel to the major surface and therefore perpendicular to the ultimate direction in which the electrons are to travel.

Figure 5B:
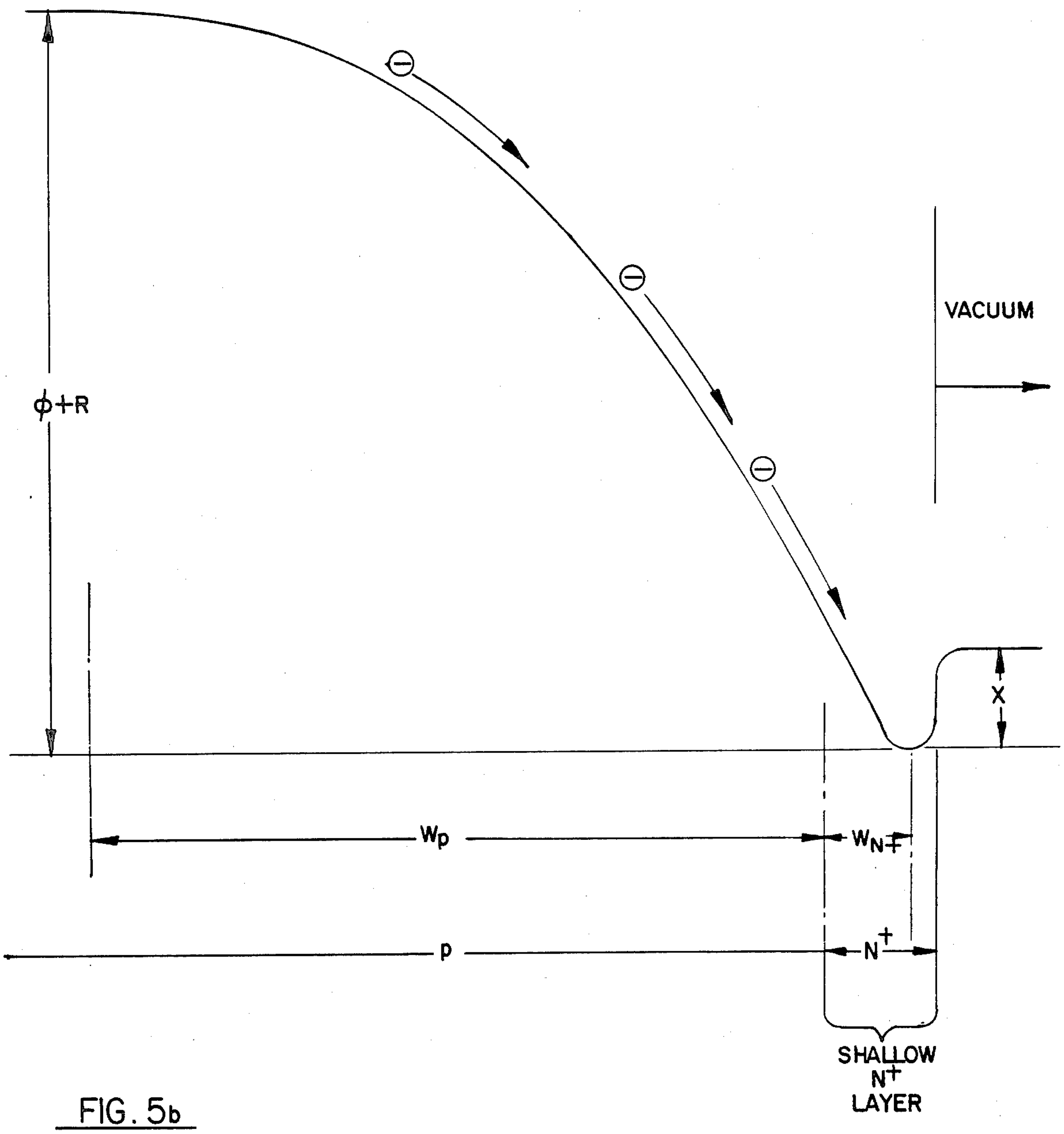
FIG. 5B is the potential energy diagram which describes the electron dynamics in the configuration of the embodiment shown in FIG. 5A.

The operation of the electron device, shown in FIG. 5A may best be described in the potential energy diagram, shown in FIG. 5B.

The potential energy diagram, shown in FIG. 5B refers to potential energy in the region through the 5B—5B plane shown in FIG. 5A. The left hand portion of the figure represents the potential of the electrons in the P type substrate region. A rectifying pn junction exists between the P type substrate and the N+ type layer 50. When the N layer 50 is reversed biased with respect to the P layer 51 an electric field line $\epsilon$ represented by dotted lines. The result of the electric field $\epsilon$ is the creation of a depletion region parallel to the surface, but not extending to the surface. The depletion region has a lower potential energy which attracts electrons from the emitter into the depletion region as shown by the directions of the electrons moving from the left hand portion of FIG. 5B to the right hand portion of the figure. The source and emitter regions 51 and 50 are reversed biased so that the electrons flow from the source region into the emitter region. The exposed surface 53 of the layer 50 may be textured by means of an appropriate etching technique so as to enhance the electron emissive properties of the surface. The net effect of the potential energy diagram, as shown in FIG. 5B, is that a sufficient high internal electric field is present in the semiconductor body near the rectifying junction 52 so that conduction band electrons in the region are excited to energies greater than the electron affinity of the semiconductor material at the exposed surface 53, so that such electrons are emitted from such surface.

Figure 6A:
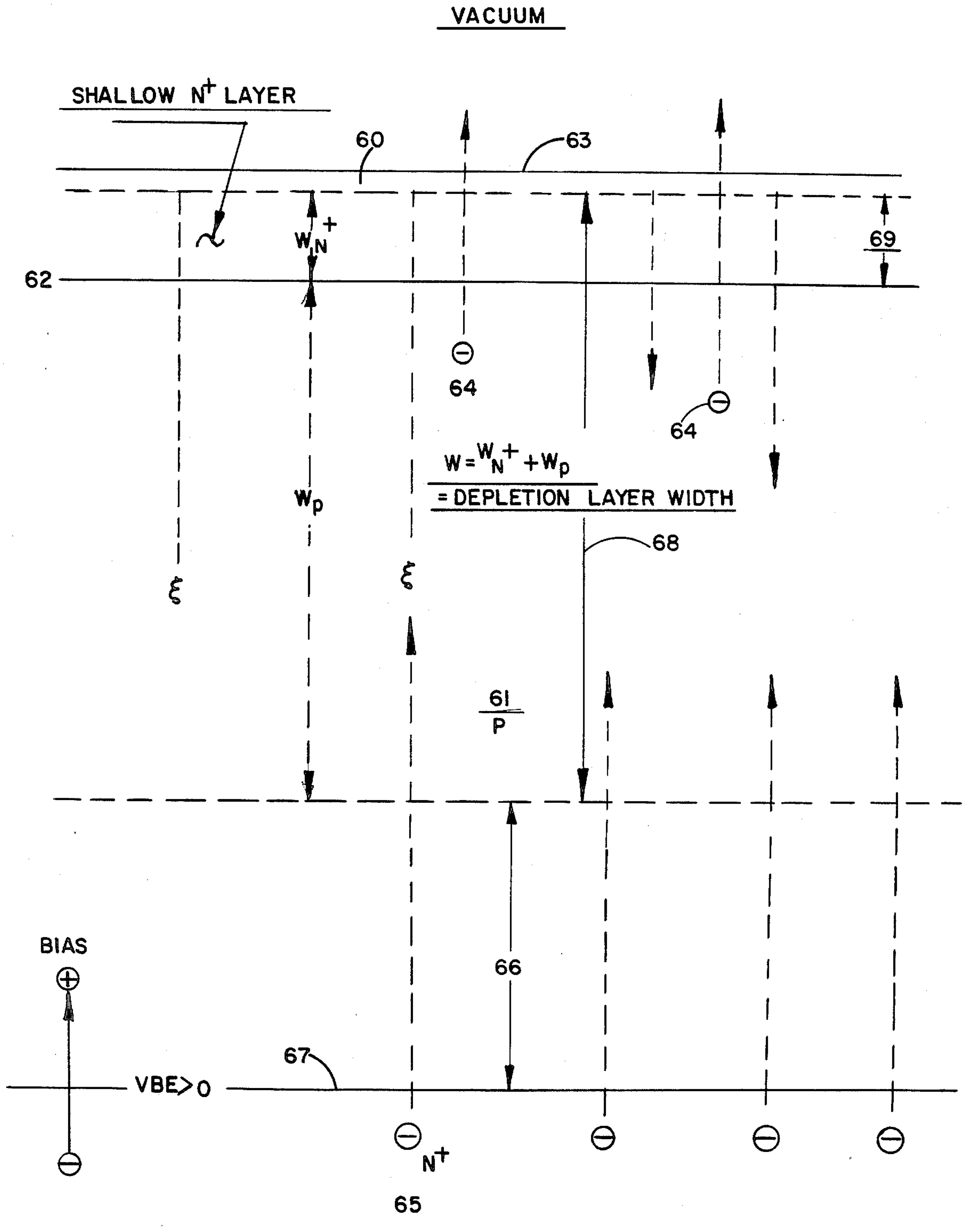
FIG. 6A is a highly enlarged and simplified cross-sectional view of a fourth embodiment of the silicon electron device according to the present invention in which electron emission is achieved by application of a large reverse bias voltage to a PN junction, the electrons being supplied by injection from an adjacent N+ region.

Another embodiment of the present invention in which conditions are created so that conduction band electrons are excited in an emitter region to energies greater than the electron affinity of the semiconductor material is through use of an injector. FIG. 6A shows a highly enlarged and simplified cross-section view of yet another embodiment of a silicon electron device according to the present invention in which electron emission is achieved by application of a large forward bias to a pn junction.

More particularly, FIG. 6A shows the portion of the semiconductor body adjacent to the vacuum into which electrons are emitted. The body includes a thin N+ conductivity type layer 60 adjacent to the vacuum. Adjoining the N+ type layer is a P conductivity type layer 61. A rectifying junction 62 is formed between layer 60 and 61 which extends substantially parallel to the exposed surface 63 of the semiconductor body. The junction is reversed biased so that electrons 64 present in the P type layer 61 are accelerated across the junction 62 into the N type region 60. It is highly advantageous in the configuration according to the present invention, that the rectifying junction 62 be disposed essentially parallel to the surface 63. Under such conditions, the electrons accelerating across the junction accelerate in the direction of the surface 63, and further in view of the fact that the junction is in the proximity of the surface 63 permits the highly energetic electrons travelling in the direction of the surface to escape therefrom into the vacuum.

Figure 6B:
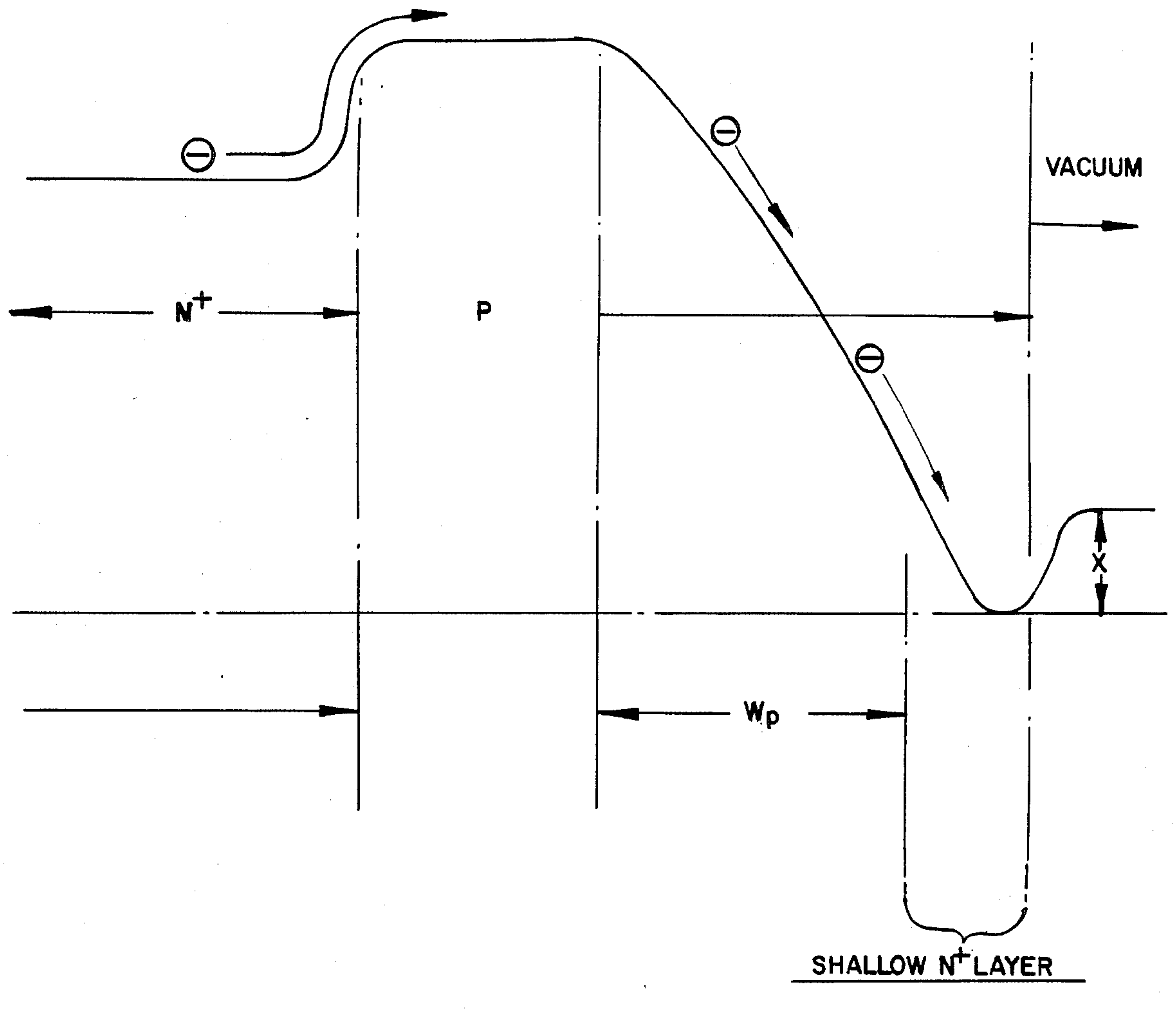
FIG. 6B is the potential energy diagram which describes the electron dynamics in the configuration of the embodiment shown in FIG. 6A.

The operation of the device of FIG. 6A is described by the potential energy diagram of FIG. 6B.

The electrons are supplied by the N+ substrate 65. A forward bias voltage applied across the junction 67 between the substrate and the P type region will result in electrons being injected from the N+ substrate 65 into the P type region 66. After diffusing a short distance through the undepleted portion of the P type region, the electrons enter the depletion layer region 68. The electrons are accelerated in the depletion region toward the surface 63, although some of the electrons enter the "finger" portion 69 of the depletion region and are collected. The electrons entering the vacuum from region 60 are accelerated to the external collector not shown. The collector is at a substantially higher potential (i.e. more positive) than region 60. Turning now to the embodiment in which one or more control grids are interposed between the emitter and the collector, reference is made to FIG. 4*a*, which structure may be combined with any of the emitter structures of FIGS. 5 and 6. In FIG. 4*a*, region 37 is biased negatively with respect to regions 36 and 38, and serves the function of a control grid or control element. The voltage applied to region 37 controls the flow of electrons to region 38.

Figure 7:
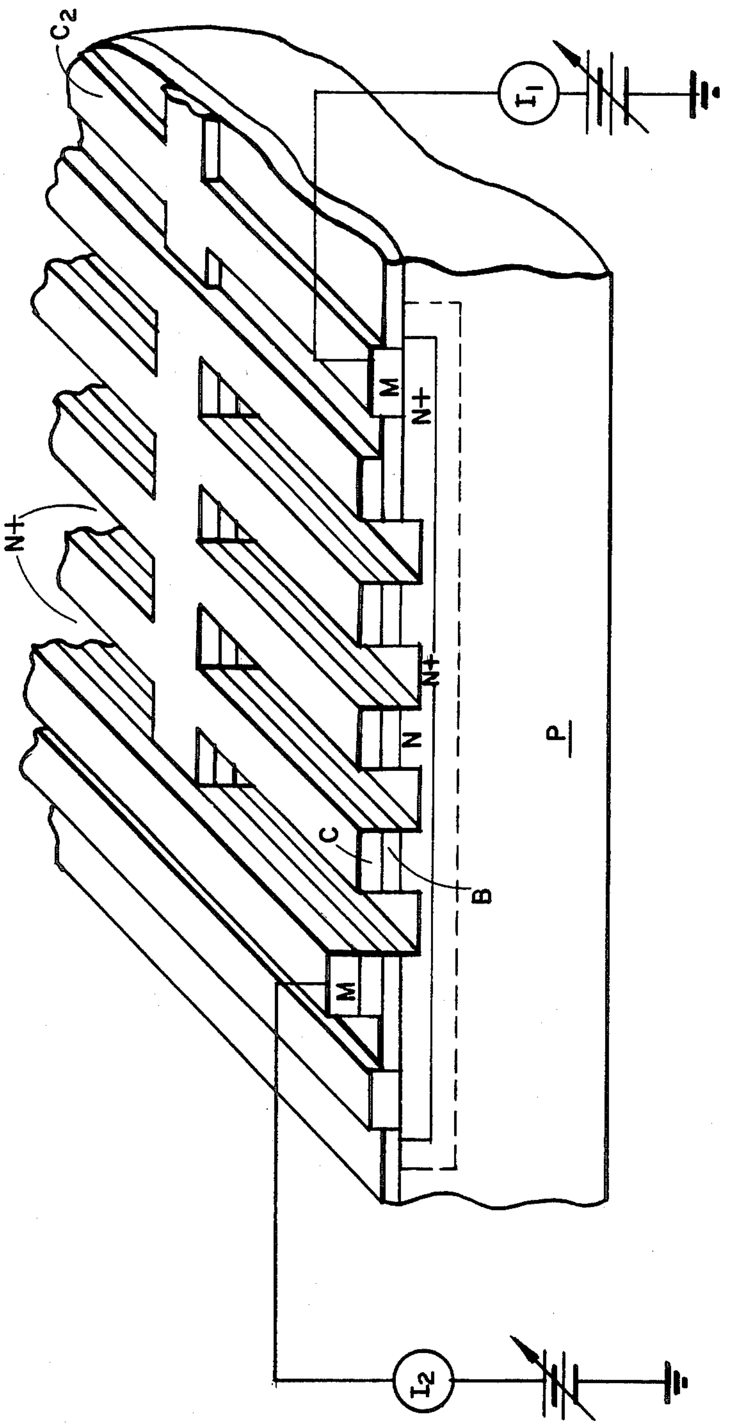
FIG. 7 is a cross-sectional view of an implementation of the present invention depicting a plurality of vacuum diode devices.

FIG. 7 is a cross-sectional view of an implementation of the present invention depicting a plurality of vacuum diode devices.

Figure 8A:
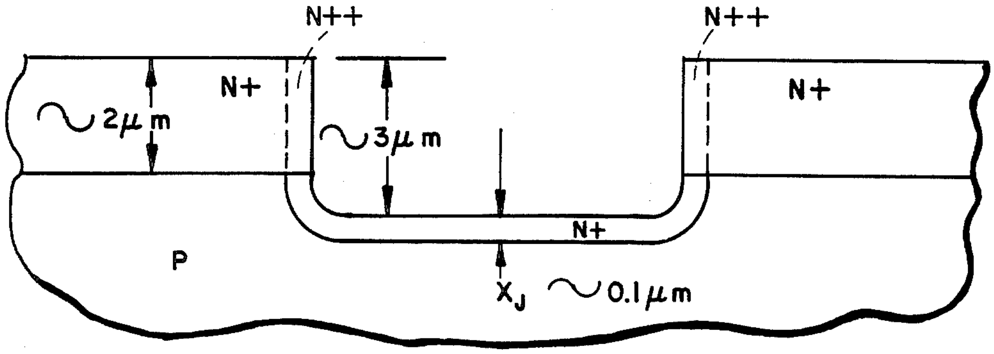
FIG. 8A is a highly enlarged cross-sectional view of the electron emissive region of the present invention in a first configuration according to the third or fourth embodiment shown in FIGS. 5A or 6A respectively.

FIG. 8A is a highly enlarged cross-sectional view of the electron emissive region of the present invention in a first configuration according to the third or fourth embodiment shown in FIGS. 5A or 6A respectively.

Figure 8B:
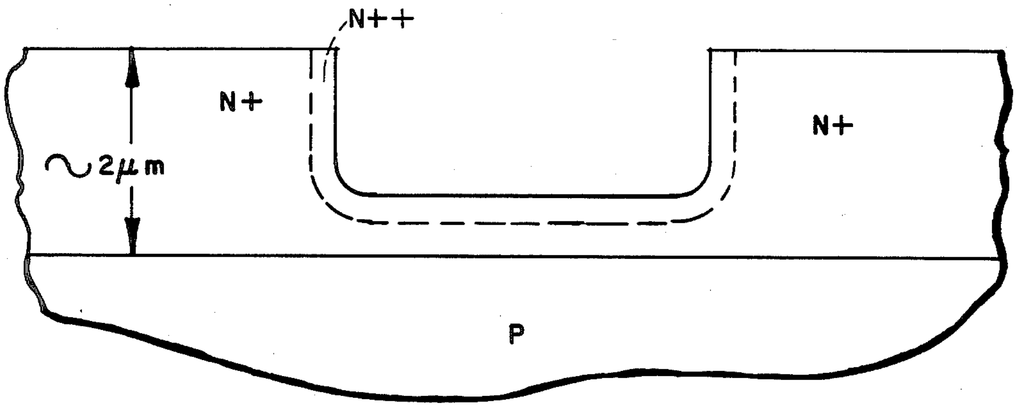
FIG. 8B is a highly enlarged cross-sectional view of the electron emissive region according to the present invention in a second configuration according to third or fourth embodiments shown in FIGS. 5A or 6A respectively.

FIG. 8B is a highly enlarged cross-sectional view of the electron emissive region according to the present invention in a second confiruration according to third or fourth embodiments shown in FIGS. 5A or 6A respectively.

Figure 9:
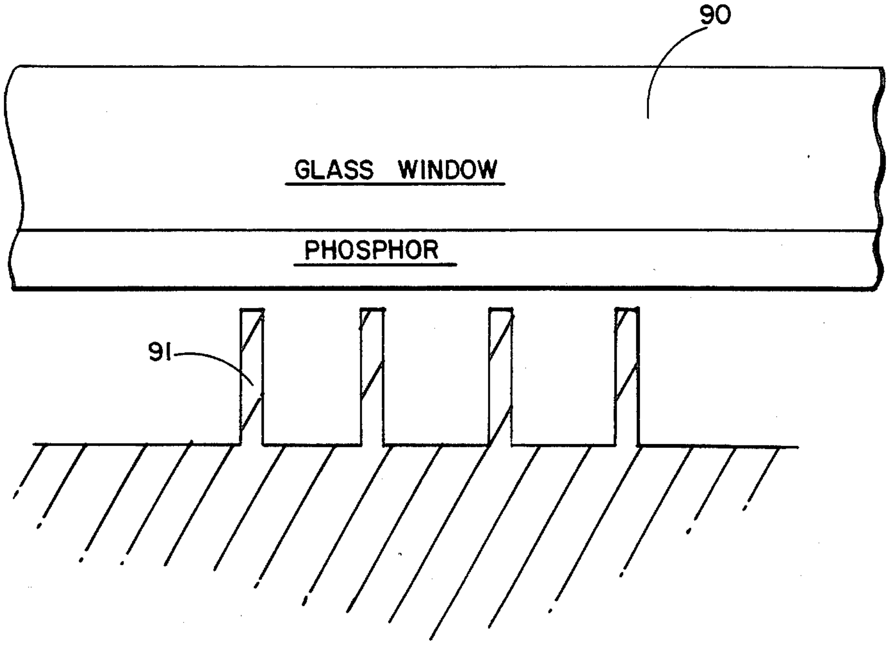
FIG. 9 is a highly enlarged and simplified cross-sectional view of an application of the present invention to a flat panel display.

Turning next to FIG. 9, there is shown an application of the electron device according to the present invention in a flat-panel display.

A light-emitting display based on the device structure described according to the present invention can be produced by placing a phosphor coated plate 90 adjacent to the emitter structure 91 as shown. Some of the electrons emitted by the emitter will be accelerated toward the phosphor screen 90. This acceleration can be enhanced by a large positive voltage applied to a thin metallic coating, such as aluminum, that is deposited on the phosphor coating.

While the invention has been illustrated and described as embodied in a silicon vacuum electron device, it is not intended to be limited to the details shown, since various modifications and structural changes may be made without departing in any way from the spirit of the present invention.

It will be obvious to those skilled in the art that the semiconductor device according to the present invention can be implemented with various semiconductor technologies and different combinations of known process steps, and that the preferred embodiments illustrated here are merely exemplary. The depth of penetration of the various zones and regions and in particular the configuration and distance between the active zones of the devices, as well as the concentrations of dopant species, and/or their concentration profiles, can be chosen depending upon the desired properties. These and other variations can be further elaborated by those skilled in the art without departing from the scope of the present invention.

The present invention is moreover not restricted to the particular embodiments of a vacuum electron device described. For example, it may be pointed out that semiconductor materials other than silicon, for example, $A_{III}$-$B_{V}$ compounds may be used. Furthermore, the conductivity types in the example may be interchanged, in which course the operating voltages are to be adapted. Otherwise, the values given for operating voltages are meant only to be by way of example and are chosen comparatively arbitrarily. Other types of semiconductor circuits including bipolar junction field effect transistors, MNOS (metal electrode-silicon nitride, silicon oxide-semiconductor) devices, MAOS (metal aluminum oxide, silicon oxide, semiconductor) devices, MAS (metal, aluminum oxide, semiconductor) device, floating gate FETs, and AMOS FETs (avalanche MOS FETs) may be used as well.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A vacuum electron device comprising:

a hermetically sealed container enclosing a vacuum;

a semiconductor device in said container comprising a semiconductor body including an electron emissive source portion for emitting electrons into the vacuum and a collector portion for collecting electrons emitted from said electron emissive source portion and transported through the vacuum;

means for providing a high internal electric field in said semiconductor body such that electrons in said emissive source are excited to energies greater than the electron affinity of said semiconductor body; and means for establishing a potential between said electron emissive source portion and said collector portion deriving an electrical output from said electron device.

2. A device as defined in claim 1 wherein said electron emissive source comprises a layer of semiconductor material of a first conductivity type.

3. A device as defined in claim 2 wherein said collector means comprises a layer of semiconductor material of a second conductivity type.

4. A device as defined in claim 1 wherein said collector means comprises a layer of polycrystalline silicon.

5. A device as defined in claim 1 wherein said collector means comprises a layer of metal.

6. A device as defined in claim 1 wherein said electron emissive source comprises a photoelectric emitter of electrons.

7. A device as defined in claim 1 wherein said semiconductor body comprises a first layer of semiconductor material including said electron emissive source portion, and a second layer of semiconductor material spaced apart from said first layer and including said collector portion.

8. A device as defined in claim 1 wherein said means for providing a high internal field is an applied external field.

9. A device as defined in claim 1 wherein said electron emissive source comprises first and second adjacent layers of semiconductor material of opposite conductivity type, said first layer being a relatively thin layer, said second layer being a relatively thick layer, a rectifying junction formed between said first and said second layers and biased such that electrons flow from said second layer into said first layer.

10. A device as defined in claim 9 wherein said first layer includes an exposed major surface region adjacent the vacuum, said major surface of said first layer being textured.

11. A device as defined in claim 9 wherein said electron emissive source includes a pn-type junction, means for providing a reverse bias on said junction so that a high electric field is produced in the region of the junction of sufficient magnitude to excite conduction band electrons in said region to energies greater than the electron affinity of said semiconductor material such that the electrons are emitted from the surface of said first layer near said junction.

12. A device as defined in claim 10 wherein said electron emissive source includes a pn-type junction located near an exposed surface of said exposed surface region, means for providing a reverse bias on said junction to provide a high electric field in the region of said junction of sufficient magnitude to excite conduction band electrons in such region to produce avalanche multiplication.

13. A device as defined in claim 1 wherein said electron emissive source comprises current injector means capable of injecting carriers from said substrate into said source region.

14. A device as defined in claim 13 wherein said current injector means comprises a forward biased rectifying junction.

15. A device as defined in claim 1, wherein said electron emissive source portion and said collector portion are connected by a dielectric layer.

16. A device as defined in claim 1, wherein said electron device is a vacuum diode.

17. A device as defined in claim 1, wherein said electron device further comprises a control electrode disposed between said source portion and said collector portion.

18. A semiconductor device as defined in claim 1, wherein said semiconductor body is composed of silicon.

19. A semiconductor device comprising:

a hermetically sealed container enclosing a vacuum;

a semiconductor body in said container including a first region of semiconductor material of a first conductivity type and a first dopant concentration, and a second region of semiconductor material of a second conductivity type and a second dopant concentration disposed adjacent to said first region and separated therefrom by an intermediate layer;

grooves in said body etched entirely through said first region of semiconductor material and into said second region of semiconductor material so that a current path for charge carries is formed through vacuum between the first region of semiconductor material and said second region of semiconductor material.

20. A semiconductor device as defined in claim 19, wherein said intermediate layer is a dielectric layer.

21. A semiconductor device as defined in claim 19, wherein said first region is a semiconductor substrate and said second region is a layer of semiconductor material disposed over said substrate.

22. A semiconductor device as defined in claim 19, wherein said second region is an electrically conductive layer disposed over said first region.

23. A semiconductor device as defined in claim 22, wherein said first region and said conductive layer are separated by a dielectric layer.

24. A semiconductor device as defined in claim 22, wherein said first rcgion is an electron emissive source.

25. A semiconductor device as defined in claim 19, wherein said first region is a semiconductor layer of P conductivity type and said second layer is a semiconductor layer of N conductivity type.

26. A semiconductor device as defined in claim 19, wherein said second region is an electron emissive source and said first region is an electron collector.

27. A semiconductor device as defined in claim 19, wherein said second region is a diffused layer of semiconductor material.

28. A semiconductor device as defined in claim 19, wherein said grooves extend partially through the entire thickness of said semiconductor material.

29. A semiconductor device as defined in claim 19, wherein said first region and said second region form a vacuum diode.

30. A vacuum electron device comprising:

a hermetically sealed container enclosing a vacuum;

a semiconductor device in said container comprising a semiconductor body including an emitter region for emitting electrons into the vacuum and a collector region for collecting electrons emitted from said emitter region and transported through the vacuum;

control electrode means disposed between said emitter region and said collector region for changing the electric field between said emitter region and said collector region when a bias potential is applied thereto, thereby controlling the current between said emitter region and said collector region;

means for providing a high internal electric field in said semiconductor body such that electrons in said emitter region are excited to energies greater than the electron affinity of said semiconductor material; and means for establishing a potential between said emitter region and said collector region for deriving an electrical output from said electron device.

31. A device as defined in claim 30, wherein said emitter region comprises a layer of semiconductor material of a first conductivity type.

32. A device as defined in claim 31 wherein said collector region comprises a layer of semiconductor material of a second conductivity type.

33. A device as defined in claim 30 wherein said collector region comprises a layer of polycrystalline silicon.

34. A device as defined in claim 30 wherein said collector region comprises a layer of metal.

35. A device as defined in claim 30 wherein said emitter region comprises a photoelectric emitter of electrons.

36. A vacuum electron device comprising:

a hermetically sealed container enclosing a vacuum;

a semiconductor device in said container comprising a semiconductor body including an electron emissive source for emitting electrons into the vacuum, said electron emissive source comprising a layer of semiconductor material having an exposed major surface adjacent the vacuum, said major surface of said layer being textured for emitting electrons;

collector means for collecting electrons emitted for said electron emissive source and transported through the vacuum;

means for providing a high internal electric field in said semiconductor body such that electrons in said emissive source are excited to energies greater than the electron affinity of said semiconductor body; and means for establishing a potential between said electron emissive source and said collector means for deriving an electrical output from said electron device.

37. A device as defined in claim 36 wherein said electron emissive source comprises a layer of semiconductor material of a first conductivity type.

38. A device as defined in claim 37 wherein said collector means comprises a layer of semiconductor material of a second conductivity type.

39. A device as defined in claim 36 wherein said collector means comprises a layer of polycrystalline silicon.

40. A device as defined in claim 36 wherein said collector means comprises a layer of metal.

41. A device as defined in claim 36 wherein said electron emissive source comprises a photoelectric emitter of electrons.

42. A device as defined in claim 36 wherein said semiconductor device is a mesa-structure disposed on a semiconductor substrate, said structure comprising a first layer disposed on said substrate including said electron emissive source, and a second layer spaced apart from said first layer and including said collector means.

43. A device as defined in claim 36 wherein said means for providing a high internal field is an applied external field.

44. A device as defined in claim 36 wherein layer of semiconductor material of said electron emissive source comprises first and second adjacent layers of semiconductor material of opposite conductivity type, said first layer being a relatively thin layer, said second layer being a relatively thick layer, a rectifying junction formed between said first and said second layers and biased such that electrons flow from said second layer into said first layer.

45. A device as defined in claim 44 wherein said electron emissive source includes a pn-type junction, means for providing a reverse bias on said junction so that a high electric field is produced in the region of the junction of sufficient magnitude to excite conduction band electrons in said region to energies greater than the electron affinity of said semiconductor material such that the electrons are emitted from the semiconductor material such that the electrons are emitted from the surface of said first layer near said junction.

46. A device as defined in claim 36 wherein said electron emissive source includes a pn-type junction located near an exposed surface of said exposed surface region, means for providing a reverse bias on said junction to provide a high electric field in the region of said junction of sufficient magnitude to excite conduction band electrons in such region to produce avalanche multiplication.

47. A device as defined in claim 36 wherein said electron emissive source comprises current injector means capable of injecting carriers from said substrate into said surface region.

48. A device as defined in claim 47 wherein said current injector means comprises a forward biased rectifying junction.

49. A device as defined in claim 36 wherein said electron emissive source and said collector means are connected by a dielectric layer.

50. A device as defined in claim 36 wherein said electron device is a vacuum diode.

51. A semiconductor device as defined in claim 36 wherein said semiconductor body is composed of silicon.

52. A vacuum electron device comprising:

a hermetically sealed container enclosing a vacuum;

a semiconductor device in said container comprising a mesa-structure disposed on a semiconductor substrate, said structure comprising a first layer including an electron emissive source for emitting electrons into the vacuum and a second layer spaced apart from said first layer and including collector means for collecting electrons emitted from said electron emissive source and transported through the vacuum;

means for providing a high internal electric field in said semiconductor body such that electrons in said emissive source are excited to energies greater than the electron affinity of said semiconductor body; and means for establishing a potential between said electron emissive source and said collector means for deriving an electrical output from said electron device.

53. A device as defined in claim 52 wherein said electron emissive source comprises a layer of semiconductor material of a first conductivity type.

54. A device as defined in claim 53 wherein said collector means comprises a layer of semiconductor material of a second conductivity type.

55. A device as defined in claim 52 wherein said collector means comprises a layer of polycrystalline silicon.

56. A device as defined in claim 52 wherein said collector means comprises a layer of metal.

57. A device as defined in claim 52 wherein said electron emissive source comprises a photoelectric emitter of electrons.

58. A device as defined in claim 52 wherein said means for providing a high internal field is an applied external field.

59. A device as defined in claim 52 wherein said electron emissive source comprises first and second adjacent layers of semiconductor material of opposite conductivity tape, said first layer being a relatively thin layer, said second layer being a relatively thick layer, a rectifying junction formed between said first and said second layers and biased such that electrons flow from said second layer into said first layer.

60. A device as defined in claim 59 wherein said first layer includes an exposed major surface region adjacent the vacuum, said major surface of said first layer being textured.

61. A device as defined in claim 59 wherein said electron emissive source includes a pn-type junction, means for providing a reverse bias on said junction so that a high electric field is produced in the region of the junction of sufficient magnitude to excite conduction band electrons in said region to energies greater than the electron affinity of said semiconductor materal such that the electrons are emitted from the surface of said first layer near said junction.

62. A device as defined in claim 61 wherein said electron emissive source includes a pn-type junction located near an exposed surface of said exposed surface region, means for providing a reverse bias on said junction to provide a high electric field in the region of said junction of sufficient magnitude to excite conduction band electrons in such region to produce avalanche multiplication.

63. A device as defined in claim 52 wherein said electron emissive source comprises current injector means capable of injecting carriers from said substrate into said surface region.

64. A device as defined in claim 63 wherein said current injector means comprises a forward biased rectifying junction.

65. A device as defined in claim 52 wherein said electron emissive source and said collecting electrode are connected by a dielectric layer.

66. A device as defined in claim 52 wherein said electron device is a vacuum diode.

67. A semiconductor device as defined in claim 52 wherein said semiconductor body is composed of silicon.

68. A vacuum electron device comprising:

a hermetically sealed container enclosing a vacuum;

a semiconductor body in said container including an electron emissive source for emitting electrons into the vacuum, comprising a first layer of semiconductor material including an exposed major surface region adjacent the vacuum, said major surface of said first layer being textured;

collector means for collecting electrons emitted from said electron emissive source and transported through the vacuum;

means for providing a high internal electric field in said semiconductor body such that electrons in said emissive source are excited to energies greater than the electron affinity of said semiconductor body; and means for establishing a potential between said electron emissive source and said collector means for deriving an electrical output from said electron device.

69. A device as defined in claim 68 wherein said electron emissive source comprises a layer of semiconductor material of a first conductivity type.

70. A device as defined in claim 69 wherein said collector means comprises a layer of semiconductor material of a second conductivity type.

71. A device as defined in claim 68 wherein said collector means comprises a layer of polycrystalline silicon.

72. A device as defined in claim 68 wherein said collector means comprises a layer of metal.

73. A device as defined in claim 68 wherein said electron emissive source comprises a photoelectric emitter of electrons.

74. A device as defined in claim 68 wherein said semiconductor device is a mesa-structure disposed on a semiconductor substrate, said structure comprising a first layer disposed on said substrate including said electron emissive source, and a second layer spaced apart from said first layer and including said collector means.

75. A device as defined in claim 68 wherein said means for providing a high internal field is an applied external field.

76. A device as defined in claim 68 wherein said electron emissive source comprises first and second adjacent layers of semiconductor material of opposite conductivity type, said first layer being a relatively thin layer, said second layer being a relatively thick layer, a rectifying junction formed between said first and said second layers and biased such that electrons flow from said second layers into said first layer.

77. A device as defined in claim 68 wherein said electron emissive source includes a pn-type junction, means for providing a reverse bias on said junction so that a high electric field is produced in the region of the junction of sufficient magnitude to excite conduction band electrons in said region to energies greater than the electron affinity of said semiconductor material such that the electrons are emitted from the surface of said first layer near said junction.

78. A device as defined in claim 77 wherein said electron emissive source includes a pn-type junction located near an exposed surface of said exposed surface region, means for providing a reverse bias on said junction to provide a high electric field in the region of said junction of sufficient magnitude to excite conduction band electrons in such region to produce avalanche multiplication.

79. A device as defined in claim 68 wherein said electron emissive source comprises current injector means capable of injecting carriers from said substrate into said surface region.

80. A device as defined in claim 79 wherein said current injector means comprises a forward biased rectifying junction.

81. A device as defined in claim 68 wherein said electron emissive source and said collecting electrode are connected by a dielectric layer.

82. A device as defined in claim 68 wherein said electron device is a vacuum diode.

83. A semiconductor device as defined in claim 68 wherein said semiconductor body is composed of silicon.

84. A semiconductor device comprising:

a hermetically sealed container enclosing a vacuum;

a semiconductor body in said container including a first region of semiconductor material of a first conductivity type and a first dopant concentration, and a second region of semiconductor material of a second conductivity type and a second dopant concentration disposed adjacent to said first region and separated therefrom by a dielectric layer; and grooves in said body etched entirely through said first region of semiconductor material and into said second region of semiconductor material so that a current path for electrons is formed through vacuum between the first region of semiconductor material and said second region of semiconductor material.

85. A semiconductor device as defined in claim 84 wherein said first region is a semiconductor substrate and said second region is a layer of semiconductor material disposed over said substrate.

86. A semiconductor device as defined in claim 84 wherein said first region is a semiconductor body portion and said second region is an electrically conductive layer disposed over said body portion.

87. A semiconductor device as defined in claim 86 wherein said semiconductor portion and said conductive layer are separated by a dielectric layer.

88. A semiconductor device as defined in claim 86 wherein said semiconductor body portion is an electron emissive source.

89. A semiconductor device as defined in claim 84 wherein said first region is a semiconductor layer of P conductivity type and said second layer is a semiconductor layer of N conductivity type.

90. A semiconductor device as defined in claim 84 wherein aid second region is an electron emissive source and said first region is an electron collector.

91. A semiconductor device as defined in claim 84 wherein said second region is a diffused layer of semiconductor material.

92. A semiconductor device as defined in claim 84 wherein said grooves extend partially through the entire thickness of said semiconductor material.

93. A vacuum electron device comprising:

a hermetically sealed container enclosing a vacuum;

a semiconductor device in said container comprising a semiconductor body including an emitter region having a textured surface of semiconductor material for emitting electrons into the vacuum;

a collector for collecting electrons emitted from said emitter region and transported through the vacuum;

control electrodes means comprising a layer of material disposed between said emitter region and said collector for controlling the current of electrons in the vacuum between said emitter region and said collector region;

means for providing a high internal electric field in said semiconductor body such that electrons in said emitter region are excited to energies greater than the electron affinity of said semiconductor material; and means for establishing a potential between said emitter region and said collector for deriving an electrical output from said electron device.

94. A device as defined in claim 93 wherein said emitter region comprises a layer of semiconductor material of a first conductivity type.

95. A device as defined in claim 94 wherein said collector comprises a layer of semiconductor material of a second conductivity type separated from said emitter region by an intermediate layer.

96. A device as defined in claim 93 wherein said collector comprises a layer of polycrystalline silicon.

97. A device as defined in claim 93 wherein said collector comprises a layer of metal.

98. A device as defined in claim 93 wherein said emitter region comprises a photoelectric emitter of electrons.

99. A vacuum electron device comprising:

a hermetically sealed container enclosing a vacuum;

a semiconductor device in said container comprising a semiconductor body including an emitter region which comprises a layer of semiconductor material of a first conductivity type for emitting electrons into the vacuum and a collector region which comprises a layer of semiconductor material of a second conductivity type for collecting electrons emitted from said emitter region and transported through the vacuum;

control electrode means comprising a layer of semiconductor material disposed between said emitter region and said collector region for controlling the charge flow between said emitter region and said collector region;

means for providing a high internal electric field in said semiconductor body such that electrons in said emitter region are excited to energies greater than the electron affinity of said semiconductor material; and means for establishing a potential on said control electrode means, and between said emitter region and said collector region, for deriving an electrical output from said electron device.

100. A device as defined in claim 99 wherein said collector region comprises a layer of polycrystalline silicon.

101. A device as defined in claim 99 wherein said collector region comprises a layer of metal.

102. A device as defined in claim 99 wherein said emitter region comprises a photoelectric emitter of electrons.

* * * * *

UNITED STATES PATENT AND TRADEMARK OFFICE

CERTIFICATE OF CORRECTION

PATENT NO. : 4,683,399

DATED : July 28, 1987

INVENTOR(S) : Sidney I. Soclof

It is certified that error appears in the above-identified patent and that said Letters Patent are hereby corrected as shown below:

Column 5, line 68, please change "(EF)" to --($E_F$)--.

Column 12, line 44, please change "carries" to --carriers--.

Column 13, line 57, please change "for" to --from--.

Column 14, lines 41 and 42, please delete "semiconductor material such that the electrons are emitted from for the".

Column 18, line 42, after "vacuum" please insert --;--.

Signed and Sealed this

Second Day of February, 1988

*Attest:*

DONALD J. QUIGG

*Attesting Officer* *Commissioner of Patents and Trademarks*